(12) United States Patent
Kim et al.

(10) Patent No.: US 10,755,607 B2
(45) Date of Patent: Aug. 25, 2020

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Minsang Kim, Suwon-si (KR); Seungwook Kwon, Hwaseong-si (KR); Ohjune Kwon, Hwaseong-si (KR); Hyojeong Kwon, Seoul (KR); Doohwan Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/166,484

(22) Filed: Oct. 22, 2018

(65) Prior Publication Data
US 2019/0139463 A1 May 9, 2019

(30) Foreign Application Priority Data
Nov. 6, 2017 (KR) .......................... 10-2017-0146990

(51) Int. Cl.
| | |
|---|---|
| *G09F 9/00* | (2006.01) |
| *G09F 9/30* | (2006.01) |
| *H01L 51/00* | (2006.01) |
| *H01L 51/52* | (2006.01) |
| *H05K 1/18* | (2006.01) |
| *H01L 27/32* | (2006.01) |

(52) U.S. Cl.
CPC .......... *G09F 9/301* (2013.01); *H01L 27/3246* (2013.01); *H01L 51/0097* (2013.01); *H01L 51/5253* (2013.01); *H05K 1/189* (2013.01); *H01L 27/3258* (2013.01); *H01L 27/3276* (2013.01); *H01L 51/529* (2013.01); *H01L 51/5237* (2013.01); *H01L 2251/5338* (2013.01); *H05K 2201/10128* (2013.01)

(58) Field of Classification Search
CPC .................... H01L 27/3246; H01L 51/0097
See application file for complete search history.

(56) References Cited

U.S. PATENT DOCUMENTS

| | | | |
|---|---|---|---|
| 2016/0093644 A1* | 3/2016 | Ki ....................... | H01L 27/1218 257/40 |
| 2017/0148826 A1 | 5/2017 | Choi | |

(Continued)

FOREIGN PATENT DOCUMENTS

| | | |
|---|---|---|
| KR | 10-2014-0032648 A | 3/2014 |
| KR | 10-2014-0099174 A | 8/2014 |

(Continued)

*Primary Examiner* — Caridad Everhart
*Assistant Examiner* — Ankush K Singal
(74) *Attorney, Agent, or Firm* — Kile Park Reed & Houtteman PLLC

(57) ABSTRACT

A display device includes a display panel having a first region, a second region spaced apart from the first region, and a bending region between the first region and the second region, the bending region being bent along a bending axis, a protective film including a first part on a first surface of the first region of the display panel, the first part having an opening at a center thereof that exposes the first surface of the display panel, and a second part on a first surface of the second region of the display panel, and a functional layer on the first surface of the display panel exposed by the opening.

14 Claims, 16 Drawing Sheets

(56) References Cited

U.S. PATENT DOCUMENTS

| | | |
|---|---|---|
| 2017/0200915 A1 | 7/2017 | Lee et al. |
| 2018/0059728 A1* | 3/2018 | Kim .................... H01L 51/0097 |
| 2018/0247992 A1* | 8/2018 | Cho .................... H01L 27/3276 |
| 2019/0081256 A1* | 3/2019 | Kim .................... H01L 51/5253 |

FOREIGN PATENT DOCUMENTS

| | | |
|---|---|---|
| KR | 10-2014-0122960 A | 10/2014 |
| KR | 10-2015-0036443 A | 4/2015 |

* cited by examiner

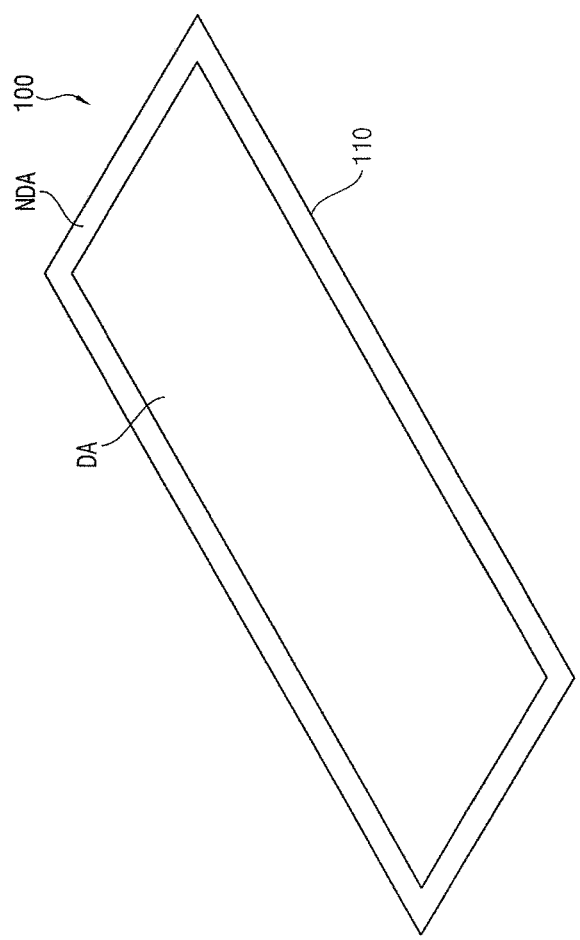

DISPLAY DEVICE AND METHOD OF MANUFACTURING THE SAME

CROSS-REFERENCE TO RELATED APPLICATION

Korean Patent Application No. 10-2017-0146990, filed on Nov. 6, 2017 in the Korean Intellectual Property Office (KIPO), and entitled: "Display Device and Method of Manufacturing the Same," is incorporated by reference herein in its entirety.

BACKGROUND

1. Field

Embodiments relate to display devices. More particularly, embodiments relate to flexible display devices and methods of manufacturing the flexible display devices.

2. Description of the Related Art

As information technology has developed, the market for display devices, which are connecting media between users and information, is increasing. Accordingly, usage of flat panel displays (FPDs), such as liquid crystal displays (LCDs), organic light-emitting diodes (OLEDs), and plasma display panels (PDPs) has increased.

If a display device has flexibility, the display device may be portable in a state of being curved, folded, or rolled, and accordingly, portability may be ensured while increasing a screen size of the display device. Accordingly, research on commercializing a display device including a flexible display panel has recently increased.

SUMMARY

Embodiments are directed to a display device including a display panel having a first region, a second region spaced apart from the first region, and a bending region between the first region and the second region, the bending region being bent along a bending axis, a protective film including a first part on a first surface of the first region of the display panel, the first part having an opening at a center thereof that exposes the first surface of the display panel, and a second part on a first surface of the second region of the display panel, and a functional layer on the first surface of the display panel exposed by the opening.

The first part of the protective film may include an inlet at at least one side thereof, the inlet exposing the first surface of the display panel.

The inlet of the first part may face the second part.

The bending region of the display panel may be in a bent state that passes by a side of the functional layer such that portions of the first surface of the display panel face each other.

The second part of the protective film may contact the side of the functional layer.

The second part of the protective film may contact a surface of the functional layer opposite to a surface that is in contact with the first surface of the display panel.

The first part of the protective film may have a "⊏" shape in a plan view.

An inlet of the "⊏" shape may face the second part of the protective film.

The first part of the protective film may have a "U" shape in a plan view.

An inlet of the "U" shape may face the second part of the protective film.

The first part of the protective film may have a "☐" shape in a plan view.

The first part of the protective film may include a first sub-part and a second sub-part respectively having a "U" shape in a plan view, the first sub-part and the second sub-part facing each other with the opening in between.

The first part of the protective film further may include a third sub-part having a "V" shape in a plan view, the third sub-part being between the first sub-part and the second sub-part.

An inlet of the "V" shape may face the second part of the protective film.

Embodiments are also directed to a method of manufacturing a display device, including preparing a protective film including a first part having an opening at a center thereof and a second part spaced apart from the first part, attaching the protective film on a first surface of the display panel, attaching a functional layer on a portion of the first surface of the display panel exposed by the opening of the first part of the protective film, and bending the display panel.

Preparing the protective film may include forming the protective film on a releasing film and attaching the protective film includes removing the releasing film.

The first part of the protective film may include an inlet exposing the first surface of the display panel, the inlet facing the second part. The display panel may be bent while passing by a side of the functional layer such that the first part and the second part of the protective film face each other.

The second part of the protective film may contact the side of the functional layer.

The second part of the protective film may contact a surface of the functional layer opposite to a surface that is in contact with the first surface of the display panel.

BRIEF DESCRIPTION OF THE DRAWINGS

Features will become apparent to those of skill in the art by describing in detail exemplary embodiments with reference to the attached drawings in which:

FIG. 1A illustrates a perspective view of a display device according to an embodiment in an unbent state.

DETAILED DESCRIPTION

Figure 1B:
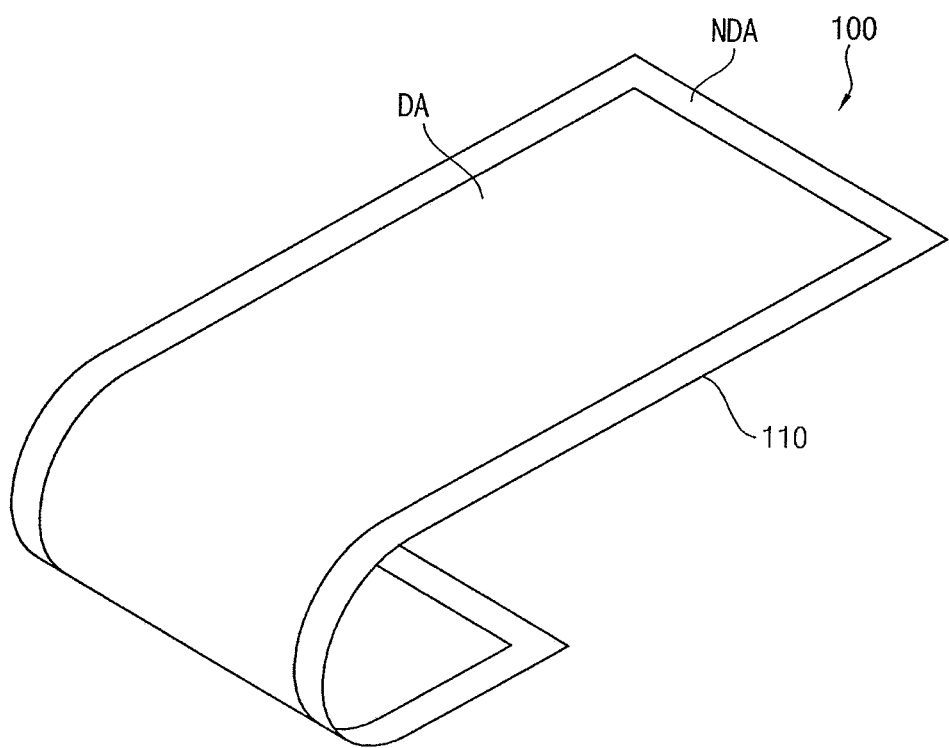
FIG. 1B illustrates a perspective view of the display device in FIG. 1A in a bent state.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1A illustrates a perspective view of a display device in an unbent state, according to an embodiment. FIG. 1B illustrates a perspective view of the display device in FIG. 1A in a bent state.

Referring to FIGS. 1A and 1B, a display device 100 according to an embodiment may include a display panel 110. The display panel 110 may include a display area DA for displaying an image and a non-display area NDA located outside the display area DA.

The display device 100 may include various layers such as a touch sensing layer, a polarizing layer, a cover window, etc. as well as the display panel 110.

The display device 100 may be deformed into various shapes such as an unbent shape, a bent shape, a rolled shape, a folded shape, or the like.

Figure 2A:
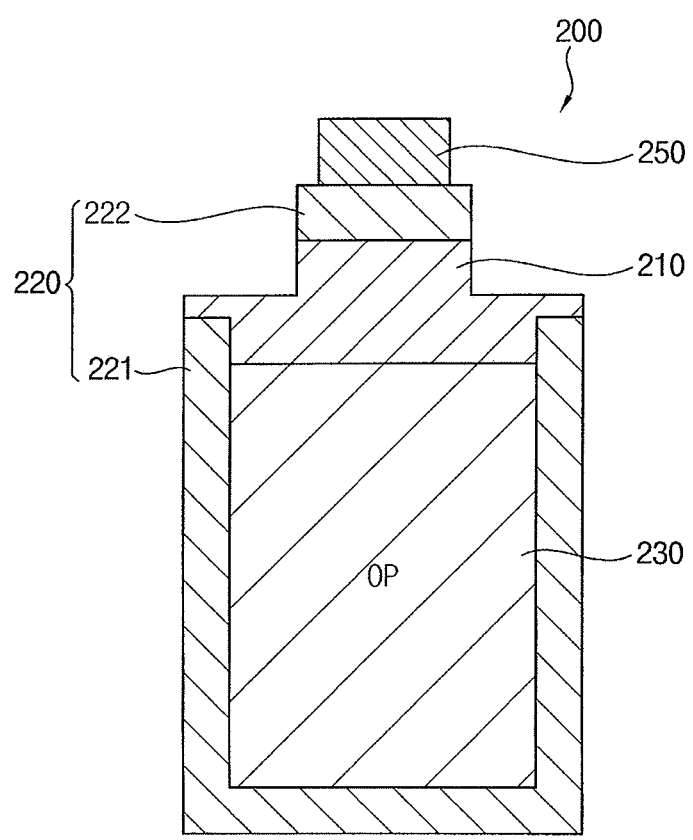
FIG. 2A illustrates a plan view pf a display device according to an embodiment in an unbent state.
Figure 2B:
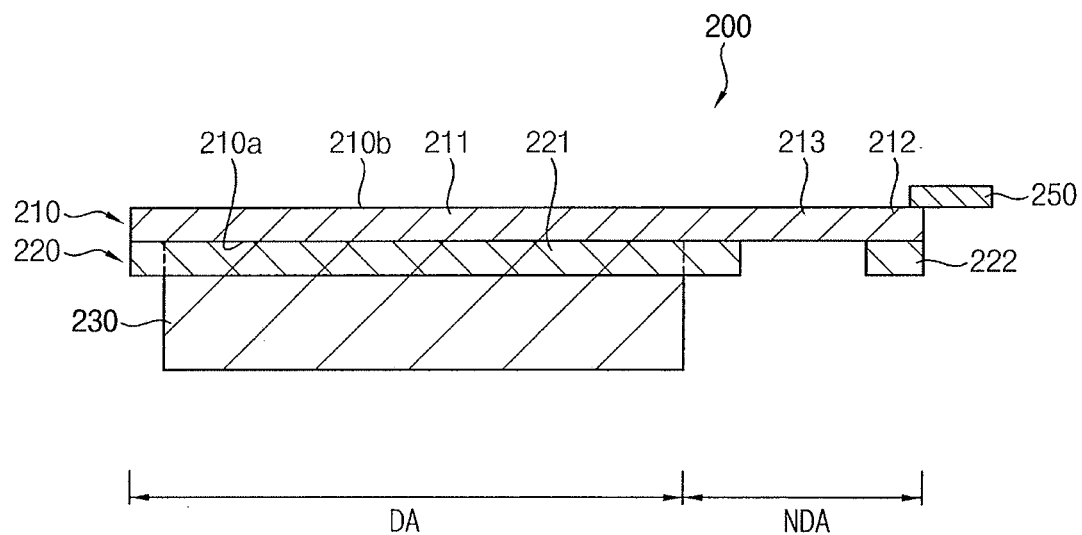
FIG. 2B illustrates a side view of the display device in FIG. 2A.

FIG. 2A illustrates a plan view of a display device according to an embodiment in an unbent state. FIG. 2B illustrates a side view of the display device in FIG. 2A.

Referring to FIGS. 2A and 2B, a display device 200 according to an embodiment may include a display panel 210, a protective film 220, a functional layer 230, and a circuit board 250.

The display panel 210 may be a suitable display panel such as an organic light emitting display panel, a liquid crystal display panel, a field emission display panel, an electronic paper display panel, or the like. For example, the display panel 210 may be an organic light emitting display panel.

The display panel 210 may have a first surface 210a and a second surface 210b, the second surface 210b being on an opposite side of the display panel from the first surface 210a. For example, the first surface 210a and the second surface 210b may be a lower surface and an upper surface of the display panel 210, respectively. The display panel 210 may include a first region 211, a second region 212, and a bending region 213.

The first region 211 may be substantially flat. A plurality of pixels may be disposed in the first region 211 to display an image.

The second region 212 may be spaced apart from the first region 211. The second region 212 may be substantially flat. A plurality of pads may be located in the second region 212. The pads may be electrically connected to the pixels.

The bending region 213 may be located between the first region 211 and the second region 212. The bending region 213 may be bendable, rollable, or foldable.

A portion of the first region 211 outside the display area DA, the second region 212, and the bending region 213 may form the non-display area NDA.

Elements of the display panel 210 will be described in detail below with reference to FIG. 5.

The protective film 220 may be disposed on the display panel 210. The protective film 220 may be disposed on the first surface 210a of the display panel 210. The protective film 220 may protect the first surface 210a of the display panel 210. In an embodiment, a thickness of the protective film 220 may be in a range from about 80 μm to about 100 μm.

In an embodiment, the protective film 220 may include at least one of polyethylene terephthalate (PET), polyethylene naphthalate (PEN), and polyethylene sulfide (PES), and polyethylene (PE).

The protective film 220 may include a first part 221 and a second part 222. The first part 221 of the protective film 220 may be disposed on the first surface 210a of the first region 211 of the display panel 210, and the second part 222 of the protective film 220 may be disposed on the first surface 210a of the second region 212 of the display panel 210. The protective film 220 may be absent from the first surface 210a of the bending region 213 of the display panel 210.

The protective film 220 may have sufficient strength to perform a function of protecting the first surface 210a of the display panel 210. If the protective film 220 were to have low flexibility, exfoliation could occur between the display panel 210 and the protective film 220 when the bending region 213 of the display panel 210 is bent, rolled, or folded. However, in the display device 200 according to the embodiment, the protective film 220 is not disposed on the bending region 213 of the display panel 210. Accordingly, the occurrence of exfoliation may be effectively prevented or reduced.

The first part 221 of the protective film 220 may include an opening portion OP at a center thereof exposing the first surface 210a of the display panel 210. The first part 221 of the protective film 220 may be disposed on an edge of the first surface 210a of the first region 211 of the display panel 210, and may be absent from a center thereof.

Shapes of the first part 221 of the protective film 220 will be described in detail below with reference to FIGS. 4A, 4B, 4C, 4D, and 4E. Herein, the terms "opening," "opening portion OP," "inlet," and "inlet portion IN" refer to portions where the protective film 220, 330, 420, 720, 920 is absent or removed, exposing the underlying surface (for example, the first surface 210a), as opposed to the protective film covering an entirety of an underlying surface.

The functional layer 230 may be disposed on the display panel 210. The functional layer 230 may be disposed on the first surface 210a of the display panel 210 exposed by the opening portion OP of the first part 221 of the protective film 220.

In a general display device, a protective film may be disposed on an entirety of a first surface of a first region of a display panel, and a functional layer may be disposed on the protective film. Accordingly, a thickness of the general display device would include a thickness of the protective film and a thickness of the functional layer. However, in the display device 200 according to embodiments, the protective film 220 may have the opening portion OP exposing the first surface 210a of the first region 211 of the display panel 210, and the functional layer 230 may be disposed directly on the first surface 210a of the display panel 210 exposed by the opening portion OP. Accordingly, a thickness of the display device 200 according to the embodiment may be decreased by a thickness of the protective film 220.

Elements of the functional layer 230 will be described in detail below with reference to FIG. 6.

The circuit board 250 may be disposed on the display panel 210. The circuit board 250 may be disposed on the second surface 210b of the second region 212 of the display panel 210. The circuit board 250 may be a flexible printed circuit board (FPCB). The circuit board 250 may be connected to an external device, and may transfer signals between the external device and the display panel 210.

Figure 3:
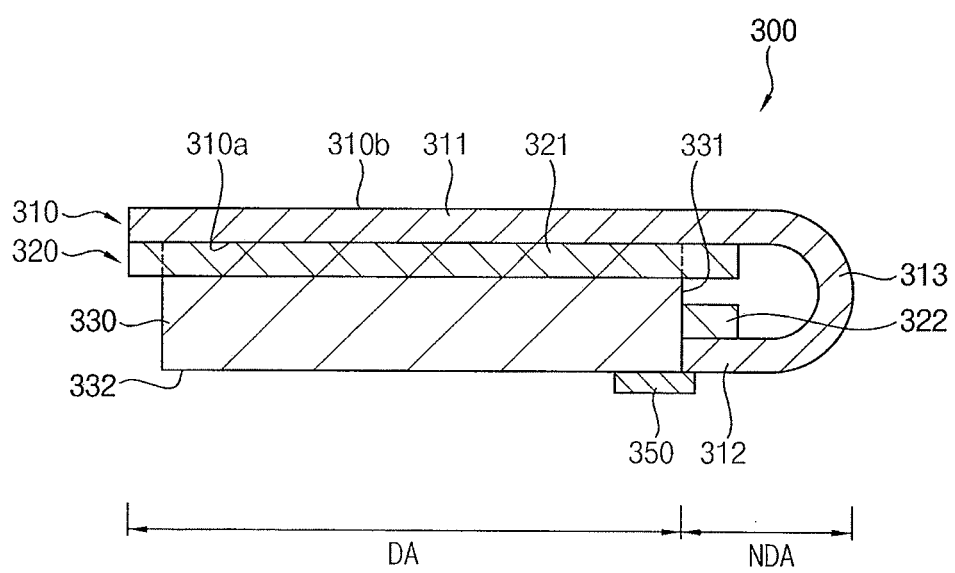
FIG. 3 illustrates a side view of a display device according to an embodiment in a bent state.

FIG. 3 illustrates a side view of a display device in a bent state according to an embodiment. For example, FIG. 3 may be a side view of the display device 200 illustrated in FIG. 2B in a bent state.

Referring to FIG. 3, a display device 300 according to an embodiment may include a display panel 310, a protective film 320, a functional layer 330, and a circuit board 350. Descriptions of elements of the display device 300 according to an embodiment with reference to FIG. 3 that are substantially the same as or similar to those of the display device 200 according to an embodiment with reference to FIG. 2, will not be repeated.

The bending region 313 of the display panel 310 may be bent along a bending axis. The bending region 313 of the display panel 310 may be bent while passing by a side 331 of the functional layer 330. The side 331 of the functional layer 330 may face a concave portion of the bending region 313 of the display panel 310 at a predetermined distance. When the bending region 313 of the display panel 310 is bent, portions of first surface 310a of the display panel 310 may face each other. For example, the first surface 310a of the first region 311 and the first surface 310a of the second region 312 of the display panel 310 may face each other.

In an embodiment, the second part 322 of the protective film 320 may contact the side 331 of the functional layer 330. For example, a side of the display panel 310 and a side of the second part 322 of the protective film 320 may be in contact with the side 331 of the functional layer 330. In this case, the functional layer 330 and the second region 312 of the display panel 310 may not overlap in a plan view.

FIGS. 4A, 4B, 4C, 4D, and 4E illustrate plan views of display panels and protective films according to embodiments. FIGS. 4A, 4B, 4C, 4D, and 4E illustrate plan views only of the display panel 210 and the protective film 220 of the display device according to embodiments with reference to FIG. 2 for describing shapes of the protective film 220.

Figure 4A:
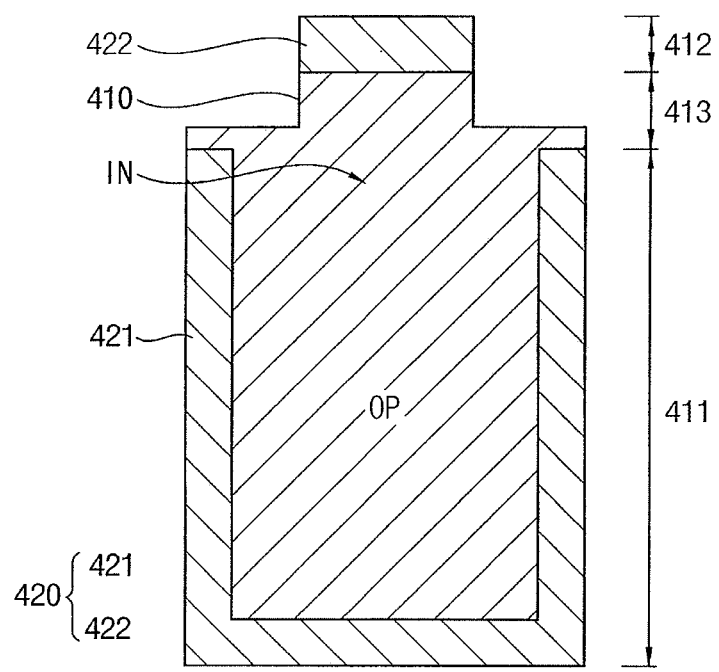
FIGS. 4A, 4B, 4C, 4D, and 4E illustrate plan views of display panels and protective films according to embodiments.

Referring to FIG. 4A, the protective film 420 may include the first part 421 disposed on the first surface 410a of the first region 411 of the display panel 410 and the second part 422 disposed on the first surface 410a of the second region 412 of the display panel 410. The first part 421 of the protective film 420 may have the opening portion OP exposing the first surface 410a of the display panel 410.

In this embodiment, the first part 421 of the protective film 420 may have an inlet portion IN at at least one side thereof in a plan view that exposes the first surface 410a of the display panel 410. The inlet portion IN may be adjacent to the opening portion OP.

In this embodiment, the inlet portion IN may face the second part 422 of the protective film 420. For example, the inlet portion IN may be located at a portion of the first part 421 of the protective film 420 adjacent to the second part 422 of the protective film 420. In this case, the protective film 420 may be absent from a center of the first region 411, at a portion of the first region 411 adjacent to the bending region 413, and from the bending region 413 among the first surface 410a of the protective film 420.

If a protective film were to be disposed at a center of the first region 411 and a portion of the first region 411 adjacent to the bending region 413 of the display panel 410, bending stress could be concentrated on between the first region 411 on which the protective film is disposed and the bending region 413 on which the protective film is absent when the bending region 413 of the display panel 410 is bent. For example, such bending stress could be the result of a step in the protective film. However, in the display device according to the embodiment, the protective film 420 is absent from a center of the first region 411 and a portion of the first region 411 adjacent to the bending region 413 of the display panel 410. Accordingly, a step resulting from a difference in thickness between the protective film 420 between the first region 411 and the bending region 413 of the display panel 410 may be absent, and accordingly, a bending stress may not be concentrated.

In an embodiment, the first part 421 of the protective film 420 may have a " ⊏ " shape in a plan view. Further, an inlet portion IN of the " ⊏ " shape may face the second part 422 of the protective film 420. As used herein, the term " ⊏ " shape refers to a rectangular shape having one open end (the inlet portion IN). The first part 421 of the protective film 420 may be formed along an edge of the first surface 410a of the first region 411 outside a portion of the first region 411 of the display panel 410 adjacent to the bending region 413.

Figure 4B:
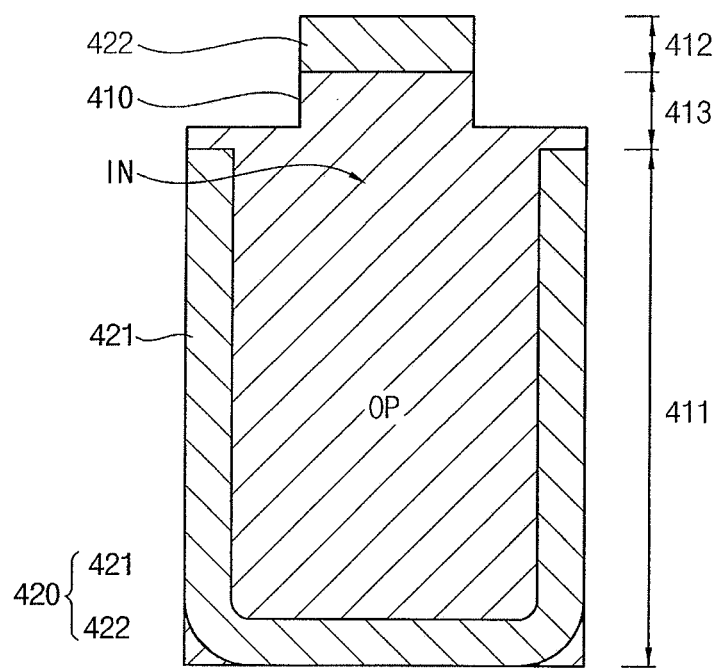

Referring to FIG. 4B, in an embodiment, the first part 421 of the protective film 420 may have a "U" shape in a plan view. For example, corners of the first part 421 of the protective film 420 may be rounded as illustrated in FIG. 4B. Further, an inlet portion IN of the "U" shape may face the second part 422 of the protective film 420. The first part 421 of the protective film 420 may be formed along an edge of the first surface 410a of the first region 411 outside a portion of the first region 411 of the display panel 410 adjacent to the bending region 413.

When corners of the first part 421 of the protective film 420 are rounded as illustrated in FIG. 4B, occurrence of rolling of the corners of the first part 421 of the protective film 420 corresponding to corners of the first region 411 of the display panel 410 may be prevented or minimized.

Figure 4C:
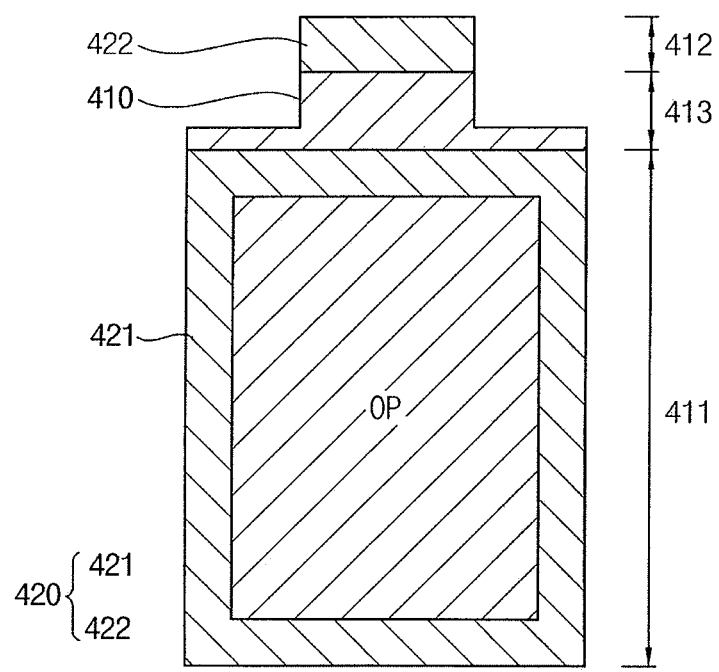

Referring to FIG. 4C, in an embodiment, the first part 421 of the protective film 420 may have a "☐" shape in a plan view. In this case, the first part 421 of the protective film 420 may not have the inlet portion W. Herein the term "☐" shape refers to a rectangular shape not having an open end.

Figure 4D:
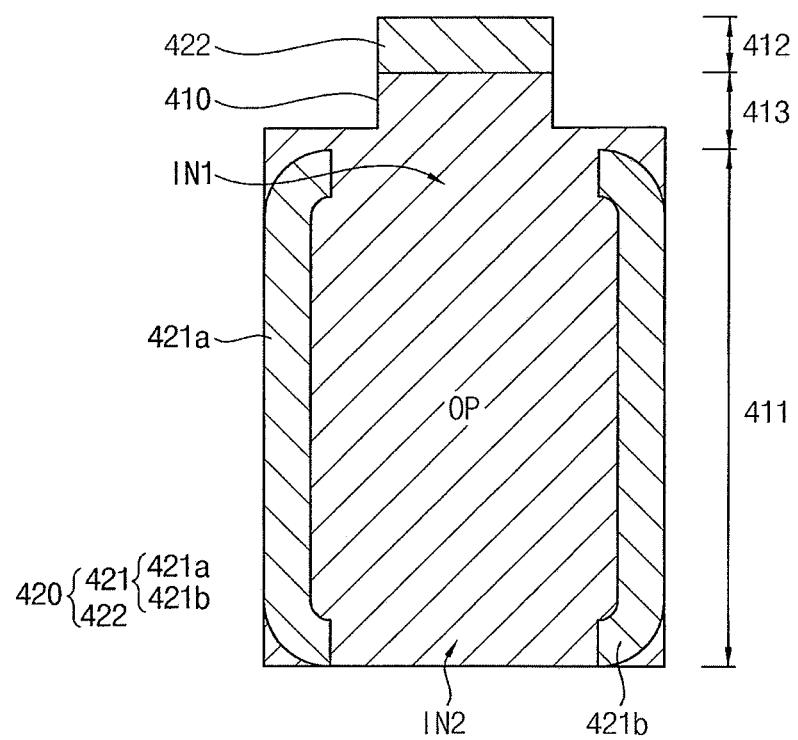

Referring to FIG. 4D, in an embodiment, the first part 421 of the protective film 420 may include a first sub-part 421a and a second sub-part 421b respectively having a "U" shape in a plan view, and facing each other with the opening portion OP in between. For example, an inlet portion of the "U" shape of the first sub-part 421a and an inlet portion of the "U" shape of the second sub-part 421b may face each other and may be spaced apart from each other in a predetermined distance. In this case, the first part 421 of the protective film 420 may have a first inlet portion IN1 and a second inlet portion IN2 which face each other.

Figure 4E:
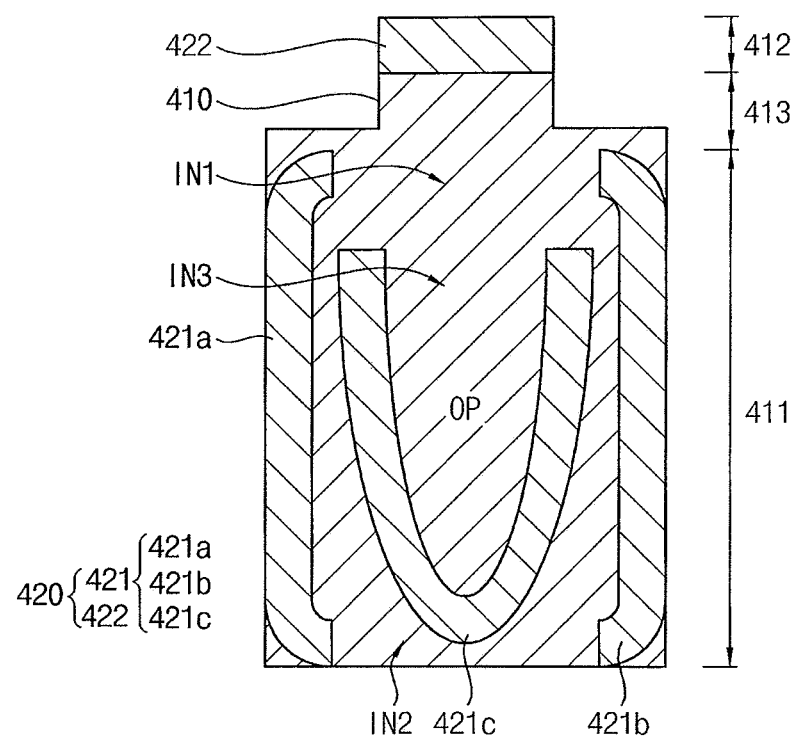

Referring to FIG. 4E, in an embodiment, the first part 421 of the protective film 420 may include a first sub-part 421a and a second sub-part 421b respectively having a "U" shape in a plan view, and facing each other with the opening portion OP in between, and a third sub-part 421c located between the first sub-part 421a and the second sub-part 421b. The third sub-part 421c may have a "V" shape in a plan view. An inlet portion IN3 of the "V" shape may face the second part 422 of the protective film 420.

In an embodiment, the first region 411 of the display panel 410 may be bent similar to the bending region 413, and the display panel 410 may be bent along the third sub-part 421c of the protective film 420 having the "V" shape. In this case, the functional layer 230 in FIG. 2A disposed on the first surface 410a of the first region 411 of the display panel 410 may have a planar shape for being located inside the third sub-part 421c of the protective film 420 having the "V" shape.

Figure 5:
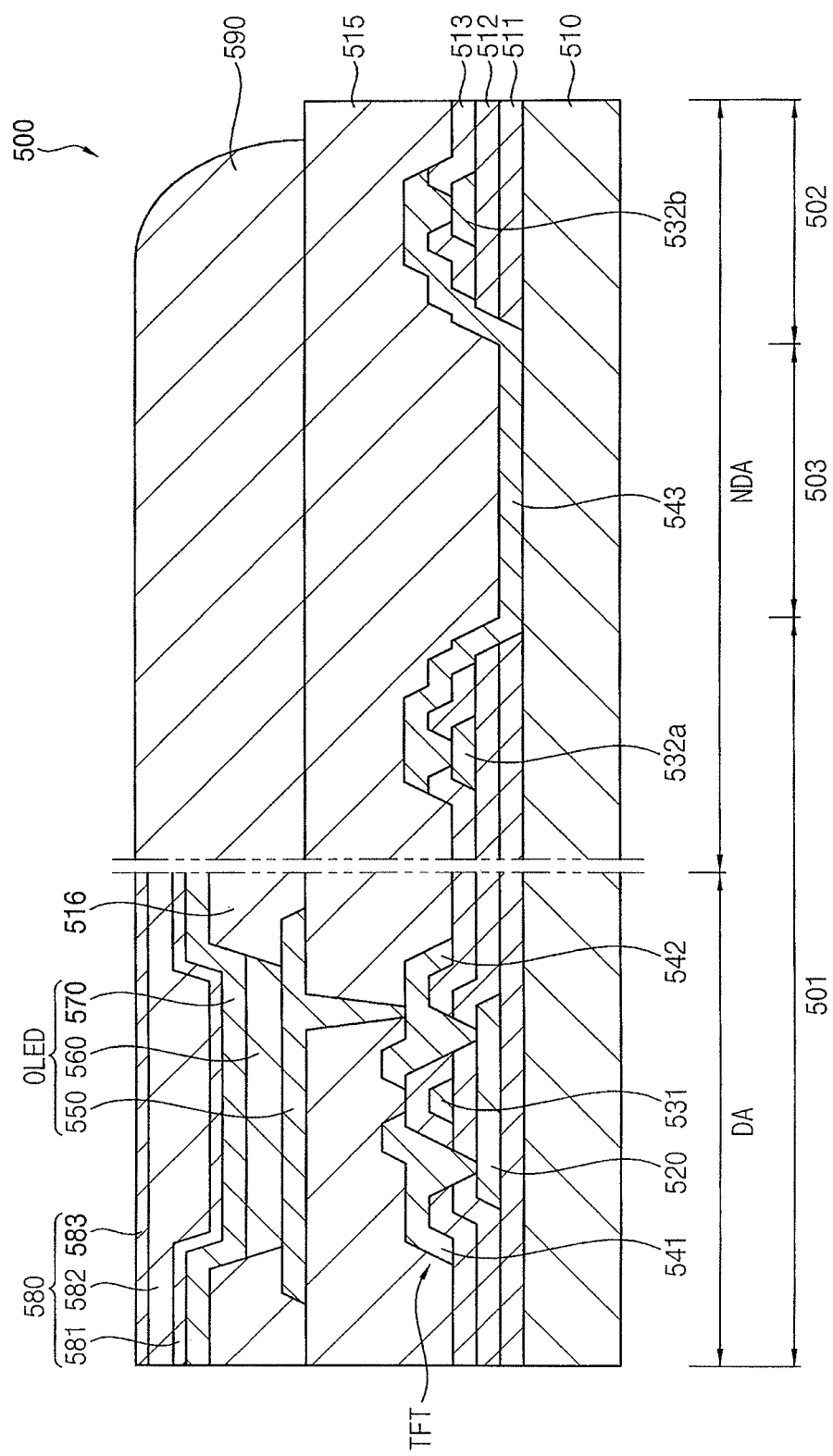
FIG. 5 illustrates a cross-sectional view of a display panel according to an embodiment.

FIG. 5 illustrates a cross-sectional view of a display panel according to an embodiment.

Referring to FIG. 5, a display panel 500 according to an embodiment may include a substrate 510, a thin film transistor TFT, an organic light emitting diode OLED, and a thin film encapsulation layer 580. The display panel 500 according to the embodiment may include a first region 501, a second region 502, and a bending region 503 respectively corresponding to the first region 311, the second region 312, and bending region 313 of the display panel 310 in FIG. 3.

The substrate 510 may be a flexible glass substrate or a flexible plastic substrate. The substrate 510 may be transparent, translucent, or opaque.

A buffer layer 511 may be disposed on the substrate 510. The buffer layer 511 may function as a barrier layer that effectively reduces or prevents dispersion of impurity ions and infiltration of moisture or external air. The buffer layer 511 may planarize a surface of the substrate 510.

In an embodiment, the buffer layer 511 may include an inorganic material, and may be located only in the first region 501 and the second region 502. For example, the buffer layer 511 including the inorganic material may be patterned to overlap only the first region 501 and the second region 502 and may be absent from the bending region 503.

The thin film transistor TFT may be disposed on the buffer layer 511. In an embodiment, the thin film transistor TFT may have a top gate transistor structure. In some implementations, the thin film transistor TFT may have other transistor structures such as a bottom gate transistor structure or the like. The thin film transistor TFT may include an active pattern 520, a gate electrode 531, a source electrode 541, and a drain electrode 542.

The active pattern 520 may be disposed on the buffer layer 511. The active pattern 520 may include a source region and a drain region, which are doped with N-type impurities or P-type impurities. A channel region that is not doped with impurities may be located between the source region and the drain region. The active pattern 520 may include an organic semiconductor, an inorganic semiconductor or polycrystalline silicon. In an embodiment, the active pattern 520 may include an oxide semiconductor.

A gate insulation layer 512 may be disposed on the active pattern 520. The gate insulation layer 512 may insulate the active pattern 520 from the gate electrode 531 disposed thereon.

The gate electrode 531 may be disposed on the gate insulation layer 512. The gate electrode 531 may be formed of metal having great conductivity. The gate electrode 531 may have a single-layered structure or a multi-layered structure.

An insulation interlayer 513 may be disposed on the gate electrode 531. The insulation interlayer 513 may insulate the gate electrode 531 from the source and drain electrodes 541 and 542 disposed thereon.

In an embodiment, the gate insulation layer 512 and the insulation interlayer 513 may be formed of an inorganic material and may be disposed only in the first region 501 and the second region 502. For example, the gate insulation layer 512 and the insulation interlayer 513 including the inorganic material may be patterned to overlap only the first region 501 and the second region 502 and may be absent from the bending region 503.

The source electrode 541 and the drain electrode 542 may be disposed on the insulation interlayer 513. For example, contact holes may be formed by removing portions of the gate insulation layer 512 and the insulation interlayer 513, and the source electrode 541 and the drain electrode 542 may be electrically connected to the source region and the drain region of the active pattern 520, respectively.

A via insulation layer 515 may be disposed on the source electrode 541 and the drain electrode 542. The via insulation layer 515 may include an insulating material. For example, the via insulation layer 515 may have a single-layered or a multi-layered structure including an inorganic material, an organic material, or an organic/inorganic compound material. The via insulation layer 515 may be provided by a suitable deposition method. In an embodiment, the via insulation layer 515 may include an polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene ("BCB").

In an embodiment, the via insulation layer 515 may include an organic material and may be patterned in the first region 501 or in the second regions 502. If the via insulation layer 515 including the organic material were to be formed on the entire surface of the substrate 510, a path of supplying moisture to the organic light emitting element OLED could occur due to the organic material. Therefore, a portion of the via insulation layer 515 in the first region 501 or in the second region 502 may be removed or omitted.

The organic light emitting diode OLED may be disposed on the via insulation layer 515. The organic light emitting diode OLED may be electrically connected to the thin film transistor TFT. The organic light emitting diode OLED may include a first electrode 550, an organic light emitting layer 560, and a second electrode 570.

The first electrode 550 may be disposed on the via insulation layer 515. In an embodiment, the first electrode 550 may be connected to the drain electrode 542 through a via hole. The first electrode 550 may function as an anode, and may be formed of a suitable conductive material. The first electrode 550 may include a transparent layer or a reflective layer.

A pixel defining layer 516 may be disposed on the via insulation layer 515. The pixel defining layer 516 may cover a portion of the first electrode 550. For example, the pixel defining layer 516 may surround an edge of the first electrode 550 to define an emission region of each pixel. The first electrode 550 may be patterned per each pixel.

The organic light emitting layer 560 may be disposed on a region of the first electrode 550 exposed by etching a portion of the pixel defining layer 516. The organic light emitting layer 560 may be formed by a suitable disposition process.

In an embodiment, a hole injection layer (HIL) and/or a hole transport layer (HTL) may be additionally disposed between the first electrode 550 and the organic light emitting layer 560, and an electron transport layer (ETL) and/or an electron injection layer (EIL) may be additionally disposed on the organic light emitting layer 560.

The second electrode 570 may be disposed on the organic light emitting layer 560. The second electrode 570 may function as a cathode, and may be formed of a suitable conductive material. The second electrode 570 may include a transparent layer or a reflective layer.

The thin film encapsulation layer 580 may be disposed on the organic light emitting diode OLED to protect the organic light emitting diode OLED from external moisture or oxygen. The thin film encapsulation layer 580 may include inorganic layers and organic layers that are alternately stacked. The inorganic layers may effectively reduce or prevent the infiltration of oxygen or moisture, and the organic layers may absorb stress applied to the inorganic layer to provide flexibility. For example, the thin film encapsulation layer 580 may include a first inorganic layer 581, a first organic layer 582 disposed on the first inorganic layer 581, and a second inorganic layer 583 disposed on the first organic layer 582.

The buffer layer 511, the gate insulation layer 512, gate lines 532a and 532b, the insulation interlayer 513, and a data line 543 may be sequentially disposed on the substrate 510 in the edge portion of the first region 501 and the edge portion of the second region 502 adjacent to the bending region 503.

In an embodiment, the buffer layer 511 may include an inorganic material. The buffer layer 511 may be patterned to overlap only the first region 501 and the second region 502 may absent from the bending region 503. In an embodiment, the gate insulation layer 512 and the insulation interlayer 513 may include an inorganic material. The gate insulation layer 512 and the insulation interlayer 513 may be patterned to overlap only the first region 501 and the second region 502 and may be absent from the bending region 503.

An inorganic layer may have a single-layered structure or a stacked structure including metal oxide or metal nitride. Although the inorganic layer may reduce or prevent infiltration of oxygen or moisture, it may be difficult to effectively reduce stress applied thereto. Thus, according to an embodiment of the display panel 500, the buffer layer 511, the gate insulation layer 512, and the insulation interlayer 513 including the inorganic material may be substantially entirely absent from the bending region 503 at which the display panel 500 may bend. Accordingly, stress caused by bending may be reduced, and flexibility may be improved.

The data line 543 may be formed on the insulation interlayer 513. In an embodiment, the data line 543 may be formed on an entirety of the bending region 503 to connect the gate line 532a of the first region 501 and the gate line 532b of the second region 502 which are located at the opposite sides of the bending region 503. For example, the data line 543 may be connected to the gate lines 532a and 532b through a contact hole formed in the insulation interlayer 513. The data line 543 may connect the gate line 532a of the first region 501 and the gate line 532b of the second region 502, which are separate from each other. Accordingly, signals may be transferred between the first and second regions 501 and 502.

The data line 543 may include a flexible conductive material. The data line 543 may be formed to be curved on the substrate 510 in the bending region 503. When the bending region 503 is bent, stress may not largely affect the data line 543 having high flexibility, such that the data line 543 is not likely to become disconnected. Thus, flexibility of the display panel 500 may be improved.

The via insulation layer 515 may be formed on the data line 543. In an embodiment, the via insulation layer 515 may include an organic material and may be formed entirely on the bending region 503 to cover the data line 543.

When the via insulation layer 515 including the organic material is formed on the data line 543 in the bending region 503 that is bendable, the via insulation layer 515 may absorb stress applied to the bending region 503, and may provide flexibility. According to an embodiment of the display panel 500, the inorganic layer on the substrate 510 may be absent or removed in the bending region 503, and the organic layer and the data line 543 having high flexibility may be located only on the substrate 510 in the bending region 503. Thus, in such an embodiment, the stress applied to the bending region 503 may be reduced. Cracking may be reduced or prevented even when the bending is repeatedly performed.

A bending protection layer 590 covering the via insulation layer 515 may be formed thereon. At least a portion of the bending protection layer 590 may be located on the data line 543 to correspond to the bending region 503.

When a stack structure is bent, a stress neutral plane is present in the stack structure. If there were no bending protection layer 590, when the display panel 500 is bent, excessive tensile stress could be applied to the data line 543 in the bending region 503 because the location of the data line 543 may not correspond to a stress neutral plane. However, by forming the bending protection layer 590 and adjusting a thickness and a modulus of the bending protection layer 590, a location of the stress neutral plane in the structure including the substrate 510, the data line 543, and the bending protection layer 590 may be adjusted. Therefore, the stress neutral plane may be adjusted to be located around the data line 543 via the bending protection layer 590, and thus, the tensile stress applied to the data line 543 may be reduced.

Figure 6:
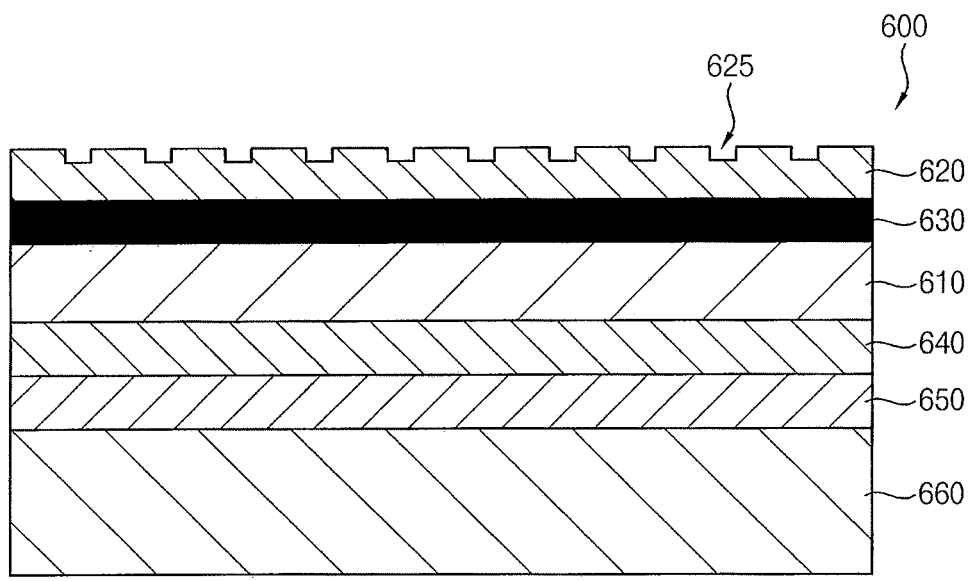
FIG. 6 illustrates a cross-sectional view of a functional layer according to an embodiment.

FIG. 6 illustrates a cross-sectional view of a functional layer according to an embodiment.

Referring to FIG. 6, a functional layer 600 according to an embodiment may include a cushion layer 610, an embossing layer 620, a black layer 630, a graphite layer 640, and a heat dissipation layer 650, and a spacing layer 660.

The cushion layer 610 may be disposed under the first region 311 in FIG. 3 of the display panel 310 in FIG. 3. The cushion layer 610 may reduce an impact that might otherwise be applied to the display panel 310. The cushion layer 610 may include polymer such as polypropylene (PP) or polyethylene (PE). In an embodiment, the cushion layer 610 may include a suitable material that has a density of about 0.5 g/cm3 or more. The cushion layer 610 may be formed as a form or gel. In an embodiment, the cushion layer 610 may include a material having a high elastic force. For example, the cushion layer 610 may include rubber.

The embossing layer 620 may be disposed between the display panel 310 and the cushion layer 610. The embossing layer 620 may have an adhesive capability. The embossing layer 620 may include, or define, a plurality of air discharge holes 625 on a surface thereof facing the display panel 310.

The black layer 630 may be disposed between the cushion layer 610 and the embossing layer 620 to prevent exposure of constituting parts such as the circuit board 350 in FIG. 3, and the like. The black layer 630 may include a black insulating material.

The graphite layer 640 may be disposed under the cushion layer 610. The graphite layer 640 may dissipate heat.

The heat dissipation layer 650 may be disposed under the graphite layer 640. The heat dissipation layer 650 may include a metal layer including, for example, copper. The heat dissipation layer 650 may emit heat that has been generated by the display panel 310 toward outside.

The spacing layer 660 may be disposed under the heat dissipation layer 650. The spacing layer 660 may support the bent display panel 310. For example, the spacing layer 660 may contact the second region 312 in FIG. 3 of the display panel 310 or the second part 322 in FIG. 3 of the protective film 320 in FIG. 3 to support the display panel 310 and to maintain a distance between the first region 311 and the second region 312 of the display panel 310.

Figure 7:
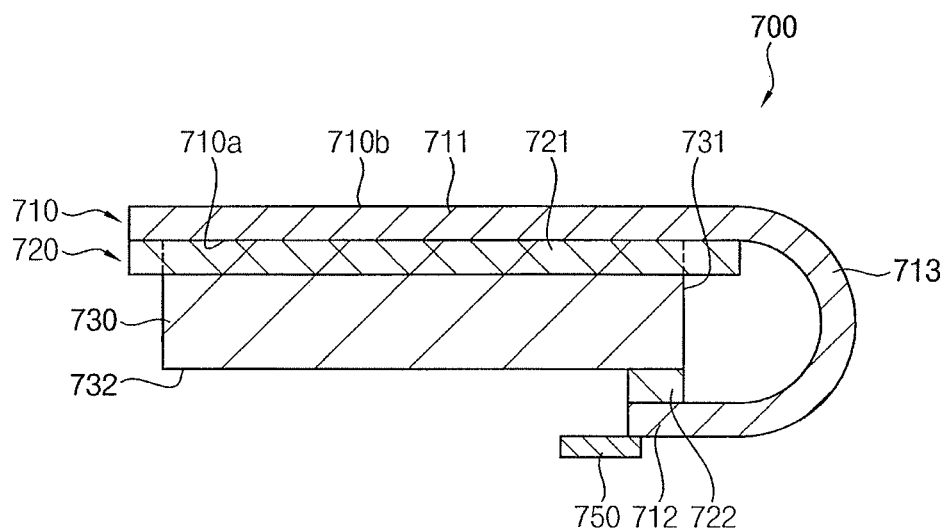
FIG. 7 illustrates a side view of a display device according to another embodiment in a bent state.

FIG. 7 illustrates a side view of a display device in a bent state according to another embodiment.

Referring to FIG. 7, a display device 700 according to an embodiment may include a display panel 710, a protective film 720, a functional layer 730, and a circuit board 750. Descriptions of elements of the display device 700 according to an embodiment with reference to FIG. 7 that are substantially the same as or similar to those of the display device 200 according to an embodiment with reference to FIG. 2, will not be repeated.

The bending region 713 of the display panel 710 may be bent along a bending axis. The bending region 713 of the display panel 710 may be bent while passing by a side 731 of the functional layer 730. The side 731 of the functional layer 730 may face a concave portion of the bending region 713 of the display panel 710 at a predetermined distance. When the bending region 713 of the display panel 710 is bent, portions of first surface 710a of the display panel 710 may face each other. For example, the first surface 710a of the first region 711 and the first surface 710a of the second region 712 of the display panel 710 may face each other.

In an embodiment, the second part 722 of the protective film 720 may contact a surface 732 of the functional layer 730 opposite to a surface being in contact with the first surface 710a of the display panel 710. The surface 732 may be a lower surface of the functional layer 730. For example, as illustrated in FIG. 7, a surface opposite to a surface of the second part 722 of the protective film 720 contacting the first surface 710a of the display panel 710 may be in contact with the lower surface 732 of the functional layer 730. In this case, the functional layer 730 and the second region 712 of the display panel 710 may be partially overlapped in a plan view. Accordingly, a width of the non-display area NDA of the display device 700 may decrease.

Figure 8:
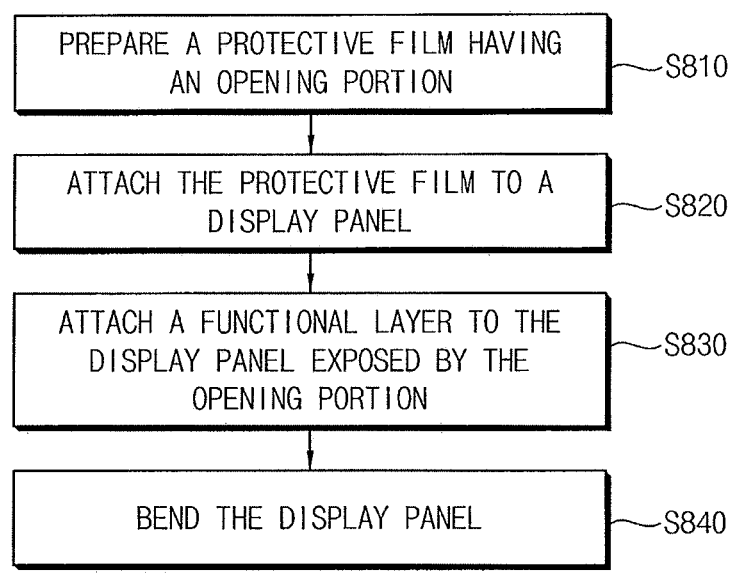
FIG. 8 illustrates a flow chart of a method of manufacturing a display device according to an embodiment.

FIG. 8 illustrates a flow chart showing a method of manufacturing a display device according to an embodiment.

Referring to FIG. 8, a method of manufacturing a display device according to an embodiment may include preparing a protective film having an opening portion S810, attaching the protective film to a display panel S820, attaching a functional layer to the display panel exposed by the opening portion S830, and bending the display panel S840.

FIGS. 9A, 9B, 10A, 10B, 11A, 11B, and 12 illustrate stages of a method of manufacturing a display device according to an embodiment.

Figure 9A:
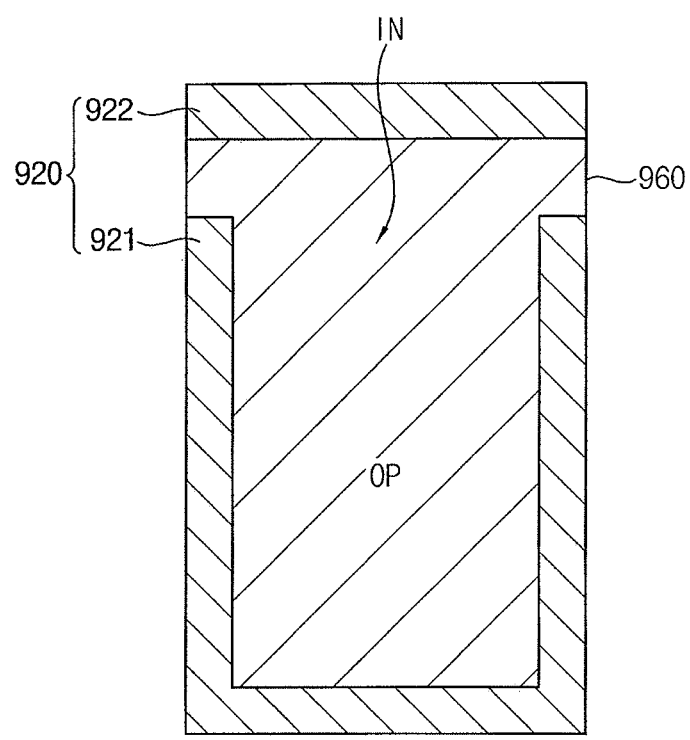
FIGS. 9A, 9B, 10A, 10B, 11A, 11B, and 12 illustrate diagrams showing stages of a method of manufacturing a display device according to an embodiment.
Figure 9B:
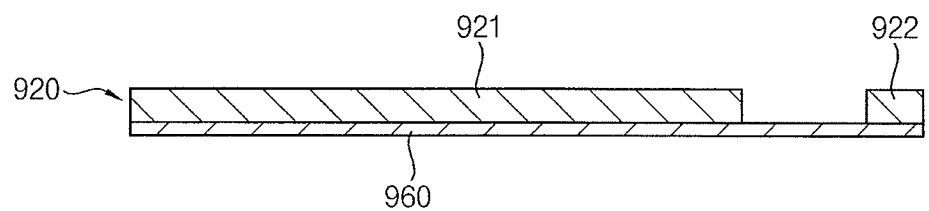

Referring to FIGS. 8, 9A, and 9B, a protective film 920 having an opening portion OP may be prepared (S810). The protective film 920 may include a first part 921 having the opening portion OP at a center thereof and a second part 922 spaced apart from the first part 921.

In an embodiment, the first part 921 of the protective film 920 may have an inlet portion IN located at at least one side thereof in a plan view. The inlet portion IN may be adjacent to the opening portion OP.

In an embodiment, the inlet portion IN may face the second part 922 of the protective film 920. For example, the inlet portion IN may be located at a portion of the first part 921 of the protective film 920 adjacent to the second part 922 of the protective film 920.

In an embodiment, the protective film 920 may be formed on a releasing film 960. The releasing film 960 may be formed on at least one surface of the protective film 920 to prevent the protective film 920 from being contaminated or in contact with other objects.

Figure 10A:
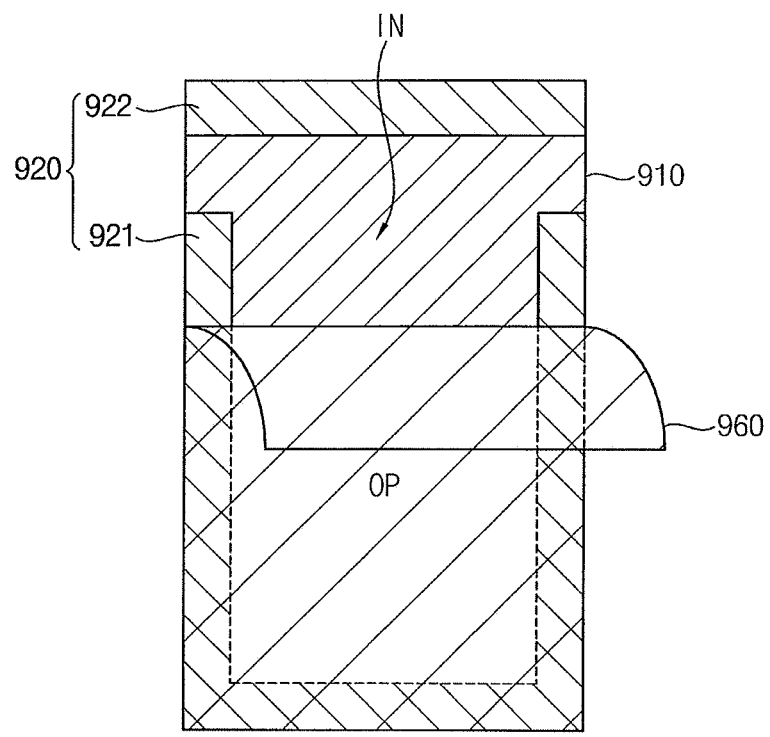
Figure 10B:
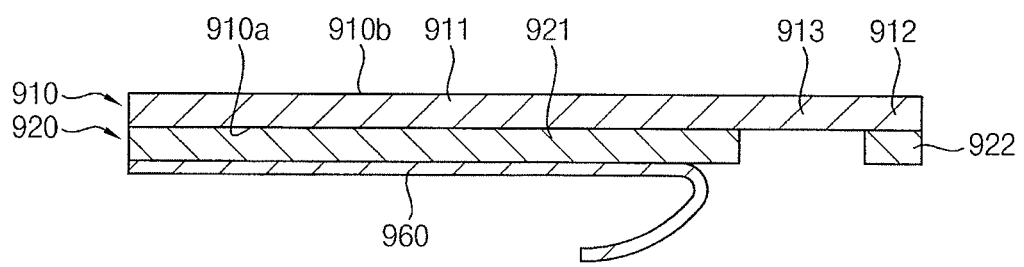

Referring to FIGS. 8, 10A, and 10B, the protective film 920 may be attached to a display panel 910 (S820). The display panel 910 may include a first region 911, a second region 912 spaced apart from the first region 911, and a bending region 913 located between the first region 911 and the second region 912. The protective film 920 may be attached to a first surface 910a of the display panel 910 such that the first part 921 and the second part 922 of the protective film 920 respectively correspond to the first region 911 and the second region 912 of the display panel 910.

In an embodiment, the releasing film 960 may be removed from the protective film 920. The releasing film 960 may be removed after the protective film 920 is attached to the first surface 910a of the display panel 910.

Figure 11A:
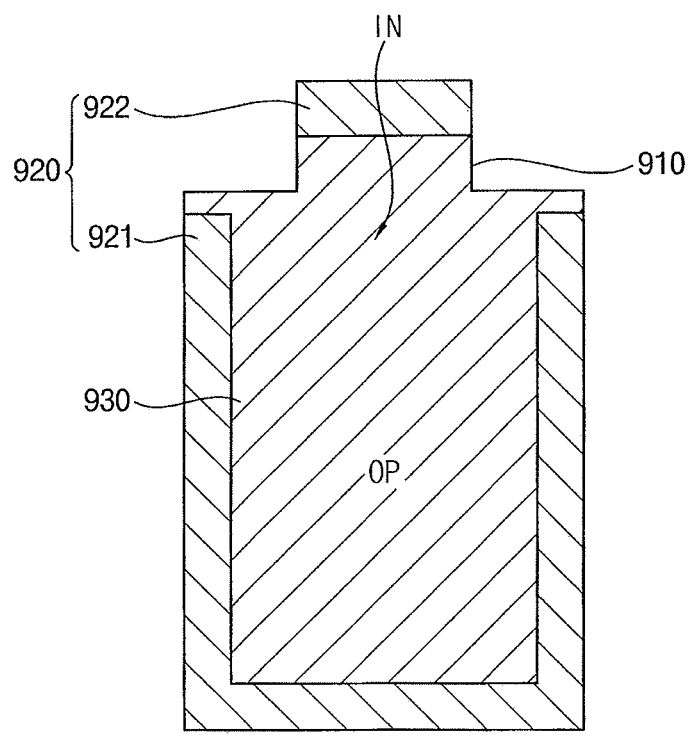
Figure 11B:
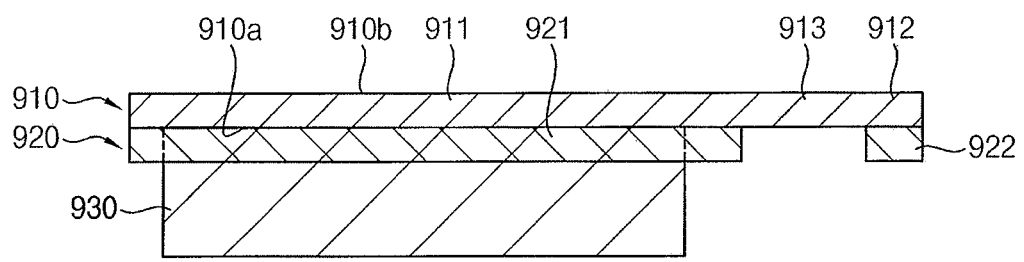

Referring to FIGS. 8, 11A, and 11B, the functional layer 930 may be attached to the display panel 910 exposed by the opening portion OP (S830). The functional layer 930 may be attached to the first surface 910a of the display panel 910 exposed by the opening portion OP.

In an embodiment, edges of the display panel 910 at which the second region 912 and the bending region 913 are located may be cut. For example, opposite edges of the display panel 910 may be cut as illustrated in FIG. 11A. Accordingly, a width of the second region 912 of the display panel 910 may be less than a width of the first region 911.

Figure 12:
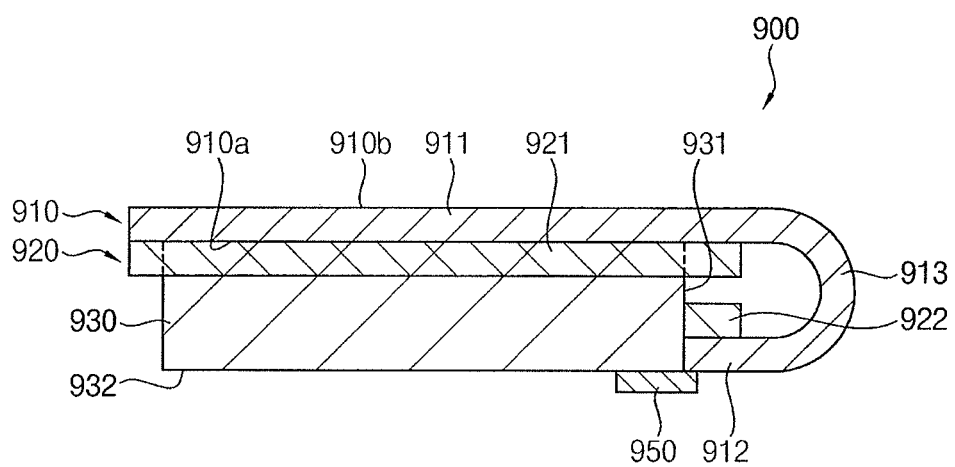

Referring to FIGS. 8 and 12, the display panel 910 may be bent (S840). The display panel 910 may be bent while passing by a side 931 of the functional layer 930 in order that the first part 921 and the second part 922 of the protective film 920, which are attached to the first surface 910a of the display panel 910, may face each other.

If a protective film were to be disposed at a center of the first region 911 and a portion of the first region 911 adjacent to the bending region 913 of the display panel 910, bending stress could be concentrated on between the first region 911 on which the protective film is disposed and the bending region 913 on which the protective film is not disposed when the bending region 913 of the display panel 910 is bent, due to a step created by the presence of the protective film. However, in the method of manufacturing the display device 900 according to the embodiment, since the protective film 920 is removed or absent from a center of the first region 911 and a portion of the first region 911 adjacent to the bending region 913 of the display panel 910, the step that could be caused by the protective film 920 between the first region 911 and the bending region 913 of the display panel 910 is absent. Accordingly, the bending stress may not be concentrated.

In an embodiment, when the display panel 910 is bent, the second part 922 of the protective film 920 may contact the side 931 of the functional layer 930. In this case, the functional layer 930 and the second region 912 of the display panel 910 may not overlap in a plan view.

In another embodiment, when the display panel 910 is bent, the second part 922 of the protective film 920 may contact a surface 932 of the functional layer 930 opposite to a surface that is in contact with the first surface 910a of the display panel 910. In this case, the functional layer 930 and the second region 912 of the display panel 910 may partially overlap in a plan view.

The display device according to the embodiments of the present disclosure may be applied to a display device included in a computer, a notebook, a mobile phone, a smartphone, a smart pad, a PMP, a PDA, an MP3 player, or the like.

By way of summation and review, embodiments provide a display device having a relatively thin thickness and including a bending region resistant to stress.

Embodiments further provide a method of manufacturing a display device having a relatively thin thickness and including a bending region resistant to stress.

According to embodiments, a display device may include a protective film including an opening portion exposing the first surface of the display panel and a functional layer disposed on a first surface of the display panel exposed by the opening portion. Accordingly, a thickness of the display device may be decreased, and stress applied to the bending region may be reduced.

In a method of manufacturing the display device according to the embodiments, the protective film having the opening portion at the center thereof may be attached to the first surface of the display panel, the functional layer may be attached to the first surface of the display panel exposed by the opening portion, and the display panel may be bent. Accordingly, the display device having a relatively thin thickness and including the bending region resistant to stress may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope there as set forth in the following claims.

What is claimed is:

1. A display device, comprising:
 a display panel having a first region, a second region spaced apart from the first region, and a bending region between the first region and the second region, the bending region being bent along a bending axis;
 a protective film including a first part on a first surface of the first region of the display panel, the first part having an opening at a center thereof that exposes the first surface of the display panel, and a second part on a first surface of the second region of the display panel; and
 a functional layer on the first surface of the display panel exposed by the opening.

2. The display device as claimed in claim 1, wherein the first part of the protective film includes an inlet at one or more sides thereof, the inlet exposing the first surface of the display panel.

3. The display device as claimed in claim 2, wherein the inlet of the first part faces the second part.

4. The display device as claimed in claim 1, wherein the bending region of the display panel is in a bent state that passes by a side of the functional layer such that portions of the first surface of the display panel face each other.

5. The display device as claimed in claim 4, wherein the second part of the protective film contacts a side of the functional layer.

6. The display device as claimed in claim 4, wherein the second part of the protective film contacts a surface of the functional layer opposite to a surface that is in contact with the first surface of the display panel.

7. The display device as claimed in claim 1, wherein the first part of the protective film has a "⊏" shape in a plan view.

8. The display device as claimed in claim 7, wherein an inlet of the "⊏" shape faces the second part of the protective film.

9. The display device as claimed in claim 1, wherein the first part of the protective film has a "U" shape in a plan view.

10. The display device as claimed in claim 9, wherein an inlet of the "U" shape faces the second part of the protective film.

11. The display device as claimed in claim 1, wherein the first part of the protective film has a "□" shape in a plan view.

12. The display device as claimed in claim 1, wherein the first part of the protective film includes a first sub-part and a second sub-part respectively having a "U" shape in a plan view, the first sub-part and the second sub-part facing each other with the opening in between.

13. The display device as claimed in claim 12, wherein the first part of the protective film further includes a third sub-part having a "V" shape in a plan view, the third sub-part being between the first sub-part and the second sub-part.

14. The display device as claimed in claim 13, wherein an inlet of the "V" shape faces the second part of the protective film.

* * * * *